United States Patent
Hofmann

(10) Patent No.: US 7,139,175 B2
(45) Date of Patent: Nov. 21, 2006

(54) ELECTRONIC DEVICE FOR A MOTOR VEHICLE

(75) Inventor: Georg Hofmann, Wetzlar (DE)

(73) Assignee: Siemens Aktiengesellschaft, München (DE)

(*) Notice: Subject to any disclaimer, the term of this patent is extended or adjusted under 35 U.S.C. 154(b) by 0 days.

(21) Appl. No.: 10/415,816

(22) PCT Filed: Nov. 1, 2001

(86) PCT No.: PCT/DE01/04093

§ 371 (c)(1),
(2), (4) Date: Nov. 26, 2003

(87) PCT Pub. No.: WO02/37915

PCT Pub. Date: May 10, 2002

(65) Prior Publication Data

US 2004/0070947 A1    Apr. 15, 2004

(30) Foreign Application Priority Data

Nov. 3, 2000 (DE) ............................... 100 54 588

(51) Int. Cl.
*H05K 5/00* (2006.01)
(52) U.S. Cl. .................. 361/752; 361/759; 701/101
(58) Field of Classification Search ............ 701/101, 701/102; 361/752, 758, 759, 790, 780, 760, 361/720, 797
See application file for complete search history.

(56) References Cited

U.S. PATENT DOCUMENTS

| | | | | |
|---|---|---|---|---|
| 3,697,945 A | * | 10/1972 | Comber | 307/10.4 |
| 5,444,314 A | * | 8/1995 | Okada | 310/40 MM |
| 5,886,875 A | * | 3/1999 | Phelps et al. | 361/752 |
| 5,941,137 A | * | 8/1999 | Beer et al. | 74/606 R |
| 6,075,296 A | * | 6/2000 | Kasbergen | 307/139 |
| 6,352,356 B1 | * | 3/2002 | Noll | 362/260 |

FOREIGN PATENT DOCUMENTS

| | | |
|---|---|---|
| DE | 78 20 391 | 6/1978 |
| DE | 43 25 499 A1 | 2/1995 |
| DE | 298 15 003 U1 | 11/1998 |
| DE | 197 37 322 A1 | 3/1999 |
| JP | 04220909 A * | 8/1992 |
| JP | 10024146 A * | 7/1999 |

* cited by examiner

Primary Examiner—Willis R. Wolfe
Assistant Examiner—Johnny H. Hoang
(74) Attorney, Agent, or Firm—Morrison & Foerster LLP

(57) ABSTRACT

The invention relates to an electronic device for a motor vehicle, for example a car radio, an onboard computer or a vehicle navigation device. According to the invention, a printed circuit board (5) is connected to a housing (1) of the device by predetermined breaking points (17). Actuating elements (8, 9) with operating parts (10, 11) are located on said printed circuit board, these operating parts protruding out from a front panel (2) of the housing (1). In the event that the operating parts (10, 11) are subjected to excessive forces, the predetermined breaking points (17) enable the printed circuit board (5) to detach from the housing (1) and move further into said housing (1), whereby the operating parts (10, 11) move into the housing (1) accordingly.

7 Claims, 1 Drawing Sheet

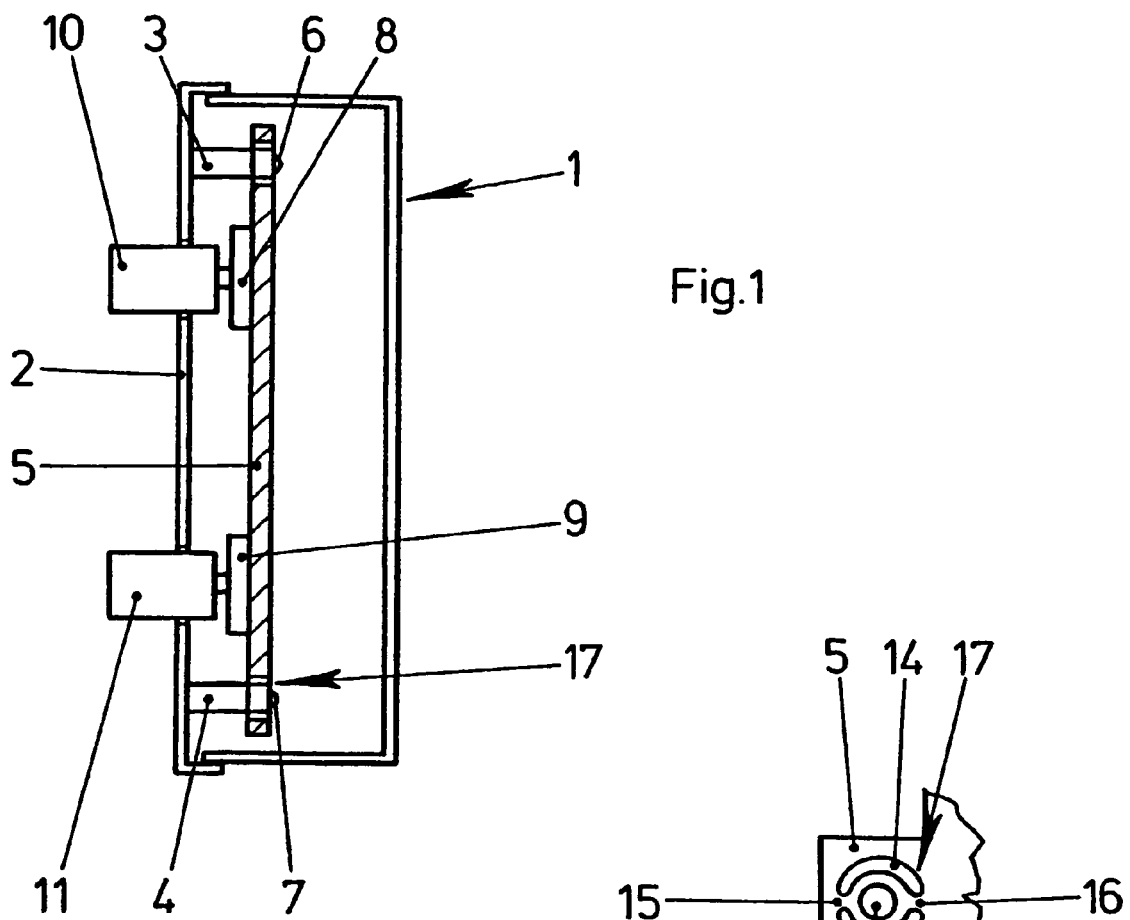
Fig.1
Fig.2
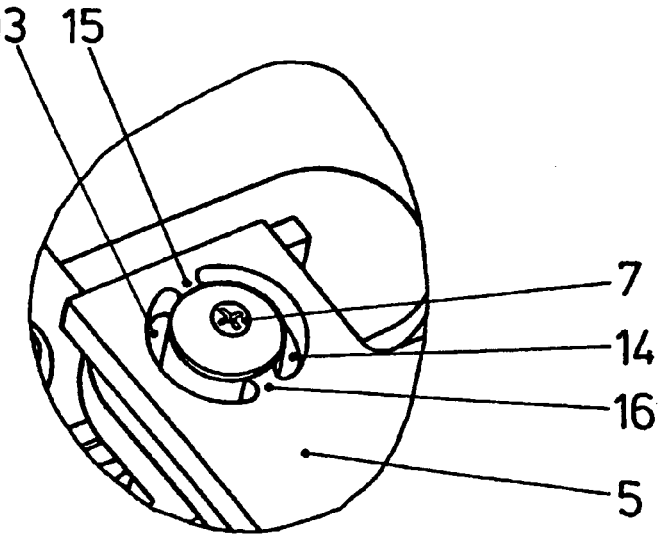
Fig.3

ELECTRONIC DEVICE FOR A MOTOR VEHICLE

CLAIM FOR PRIORITY

This application claims the benefit of priority to PCT/DE01/04093, filed Nov. 1, 2001, and published in the German language, which claims priority to German Application No. 10054588.2, filed Nov. 3, 2000.

TECHNICAL FIELD OF THE INVENTION

The invention relates to an electronic device for a motor vehicle, and in particular, to an electronic device such as a car radio, an onboard computer or a vehicle navigation system.

BACKGROUND OF THE INVENTION

A problem encountered in devices of the aforementioned type is that the passengers of the vehicle can injure themselves on protruding control elements when, for example, their heads or knees collide with such a control element. For this reason, such control elements are often made of a soft plastic, which enables them to give way elastically when subjected to impacts. In the case of electric cigarette lighters, it is already known to dispose them in such a way that they do not protrude from the contour of a surface into which they are integrated when they are not in use. Only when the cigarette lighter is pressed into the contour of the surface is it ejected from the contour, together with a gripping component, so that it can then be gripped.

In the case of electronic devices, retractable control elements that only enter into a protruding active position for the purpose of use are not acceptable, particularly for cost reasons. Furthermore, a disadvantage of such displaceable control elements would be that they can only be operated after they have been actuated to protrude from the device through application of brief, axial pressure, which, particularly in the case of frequently used control elements, would be cumbersome and could result in their not being returned to their retracted position following use, for reasons of convenience, thereby eliminating their safety benefits. The risk of suffering an injury on such control elements during the operating phase would exist if this happened to coincide with an accident.

SUMMARY OF THE INVENTION

The invention discloses an electronic device having control elements available for use without requiring prior manipulation, but which are also designed, using the simplest means possible, so as not to pose a risk of injury in the event of an accident.

According to the invention, a printed circuit board, for retracting the control element into the device when a force acting on the control element is exceeded, is secured in such a way as to be displaceable into the interior of the device.

In the invention, the control elements can be designed in the same manner as in devices not featuring retractable control elements, so that standard commercial control elements can be used. Since means of bringing about retraction must no longer be provided for each individual control element, but rather the entire printed circuit board shifts when an impact occurs on a control element, the costs of making control elements retractable are not increased by the number of control elements.

In an alternative embodiment, the printed circuit board could be biased against impact on the control side, using spring forces. Displaceability can be accomplished especially easily if, for this purpose, the printed circuit board is connected to the housing via predetermined breaking points.

The predetermined breaking points can also be provided in various ways and on various components, such as on the screws used to mount the printed circuit board. Costs can be decreased even further if, according to a further development of the invention, the predetermined breaking points are formed by breakable regions of the printed circuit board. This makes it possible, in an especially simple manner, to adjust the breakout forces to the respective requirements.

It is advantageous to design the electronic device such that the printed circuit board is mounted to the housing by means of screws, each of which passes through a hole in the printed circuit board, and the breakable regions are formed by countersunk sections of the printed circuit board, each of which surrounds the respective hole. In an embodiment of this nature, conventional printed circuit boards can be used and retrofitted with countersunk sections in the region of their mounting holes.

When the respective printed circuit board is screwed into place, the respective screws produce substantial torsional forces in the printed circuit board, which forces can cause the predetermined breaking points to break out if they are not designed to be adequately resistant to such torsional forces. However, an increase in the resistance of the predetermined breaking points against torsional forces normally results in the predetermined breaking points also acquiring increased strength in an axial direction, so that the control elements can only shift in position when adversely high forces come into place. A resistance to torsional forces that is sufficient for the screw connection and a low resistance in response to axial forces being exerted on the control element can be easily accomplished if two curved countersunk regions progressing in a coaxial direction relative to each hole are provided, and if each of the breakable regions is arranged between the ends of these countersunk regions. The curved countersunk regions also make it possible—because they enclose a more or less large angle—to modify the width of the breakable regions and thereby suitably adjust the breakout force to the applicable requirements.

The structural design of the electronic device is especially straightforward if the printed circuit board is attached to the front plate by means of the screws.

It is advantageous if the breakable regions feature different cross-sections at different points of connection. This makes it possible to take into account the position of the control elements on the printed circuit board and, therefore, their position relative to the predetermined breaking points when determining the breakout force. For example, if the predetermined breaking points should break at the same time, and if one control element is proximate to a predetermined breaking point, this predetermined breaking point can be designed to be relatively strong and the remaining predetermined breaking points can be designed to be weaker, corresponding to their greater distance from the control element, thus taking into account the respective lever arms for application of force.

BRIEF DESCRIPTION OF THE DRAWINGS

The invention allows for various embodiments. To further illustrate its basic principle, one of these embodiments is depicted in the drawing and described below. This depicts, in:

FIG. 1 a schematic cross-section through an electronic device according to the invention.

FIG. 2 a top view of a mounting region of the printed circuit board.

FIG. 3 an exploded view of a mounting region of a printed circuit board of the device.

DETAILED DESCRIPTION OF THE INVENTION

The electronic device depicted in FIG. 1 comprises a housing 1, which features a front plate 2 on its front side. Protruding inward from the front plate 2 are projections 3, 4, on which a printed circuit board 5 rests which is attached to these projections 3, 4 by means of screws 6, 7. On the printed circuit board 5 are arranged two adjustment elements 8, 9, each of which features a control element 10, 11 designed as a rotating knob. These control elements 10, 11 protrude out of the front plate 2 to such an extent that they can be comfortably gripped and rotated. The control elements 10, 11 can also be control elements operated by means of push buttons.

In the invention, the printed circuit board 5 can disengage itself from the projections 3, 4 and move into the interior of the housing 1 when high axial forces are exerted on at least one of the control elements 10, 11, such as during the impact of a passenger's head against the control elements 10, 11. To this end, predetermined breaking points 17, depicted in greater detail in the following figures, are provided in the printed circuit board 5. As a result of this displaceability of the printed circuit board 5, the control elements 10, 11 are capable of moving completely into the housing 1, so that they no longer protrude from the front plate 2.

FIG. 2 depicts a mounting region of the printed circuit board 5. Visible in the figure is a hole 12 through which the screw 6 or 7 visible is FIG. 1 can pass. This hole 12 is surrounded by two curved countersunk regions 13, 14, between the ends of which a relatively more narrow, breakable region 15, 16 of the printed circuit board remains. The respective forces introduced into the printed circuit board 5 through the control elements 10, 11 must be transferred to the screws 6, 7 through these regions 15, 16. If these forces exceed the strength of the regions 15, 16, said regions break, causing the printed circuit board 5 to become disengaged from the projections 3, 4 depicted in FIG. 1, thereby enabling the printed circuit board 5 to move into the interior of the housing 1. Thus, the countersunk regions 13, 14 generate the predetermined breaking point 17.

FIG. 2 depicts, in a perspective, an edge zone of the printed circuit board 5, along with the two countersunk regions 13, 14 and the breakable regions 15, 16, as well as the screw 7. It is evident that the printed circuit board 5 is capable of disengaging itself when the breakable regions 15, 16 break out.

What is claimed is:

1. An electronic device intended for a motor vehicle, comprising:
   a housing; and
   a printed circuit board with at least one control element mounted thereto, and projecting from a front plate of the housing, wherein the printed circuit board is secured so as to be displaceable into an interior of the device when a predetermined force is exceeded.

2. The electronic device according to claim 1, wherein to bring about the displaceability of the printed circuit board, the printed circuit board is connected to the housing via predetermined breaking points.

3. The electronic device according to claim 2, wherein the predetermined breaking points are formed by breakable regions of the printed circuit board.

4. The electronic device according to claim 1, wherein the printed circuit board is mounted to the housing by screws, each of which passes through a hole in the printed circuit board, and the breakable regions are formed by countersunk sections of the printed circuit board, each of which surrounds the respective hole.

5. The electronic device according to claim 4, wherein two curved countersunk regions progressing in a coaxial direction relative to each hole are provided, and that each of the breakable regions is arranged between ends of these countersunk regions.

6. The electronic device according to claim 1, wherein the printed circuit board is attached to the front plate by screws.

7. The electronic device according to claim 3, wherein the breakable regions feature different cross-sections at different points of connection.

* * * * *